(12) United States Patent
Burger et al.

(10) Patent No.: US 7,125,729 B2
(45) Date of Patent: Oct. 24, 2006

(54) METHOD FOR OPENING THE PLASTIC HOUSING OF AN ELECTRONIC MODULE

(75) Inventors: Klaus Burger, Weissach (DE); Dieter Mutz, Heilbronn (DE); Steffen Ziegler, Weinsberg (DE)

(73) Assignee: Atmel Germany GmbH, Heilbronn (DE)

( * ) Notice: Subject to any disclaimer, the term of this patent is extended or adjusted under 35 U.S.C. 154(b) by 0 days.

(21) Appl. No.: 10/494,434

(22) PCT Filed: Oct. 30, 2002

(86) PCT No.: PCT/EP02/12096

§ 371 (c)(1),
(2), (4) Date: Apr. 30, 2004

(87) PCT Pub. No.: WO03/039217

PCT Pub. Date: May 8, 2003

(65) Prior Publication Data

US 2005/0005748 A1    Jan. 13, 2005

(30) Foreign Application Priority Data

Nov. 2, 2001  (DE) ................................ 101 54 017
Nov. 2, 2001  (DE) ................................ 101 54 021

(51) Int. Cl.
*H01L 21/00* (2006.01)
(52) U.S. Cl. ................... 438/4; 438/8; 438/12; 438/13; 438/15; 83/74; 264/409
(58) Field of Classification Search ............... 438/4, 438/98, 598, 690, 12, 13, 14, 15, 8; 83/74; 264/409, 406
See application file for complete search history.

(56) References Cited

U.S. PATENT DOCUMENTS

| | | | |
|---|---|---|---|
| 5,281,798 A | 1/1994 | Hamm et al. | 250/205 |
| 5,326,709 A * | 7/1994 | Moon et al. | 438/4 |
| 5,424,254 A | 6/1995 | Damiot | 437/243 |
| 5,446,961 A | 9/1995 | Levite et al. | 29/850 |
| 5,616,524 A | 4/1997 | Wei et al. | 438/4 |
| 5,966,633 A | 10/1999 | Koblinger et al. | 438/667 |
| 6,379,988 B1 * | 4/2002 | Peterson et al. | 438/51 |
| 6,448,095 B1 * | 9/2002 | Birdsley et al. | 438/12 |
| 6,518,664 B1 * | 2/2003 | Miyamoto | 257/737 |
| 6,528,892 B1 * | 3/2003 | Caletka et al. | 257/781 |
| 6,565,720 B1 * | 5/2003 | Ring | 204/192.34 |
| 6,649,832 B1 * | 11/2003 | Brophy et al. | 174/52.2 |
| 6,759,259 B1 * | 7/2004 | Nikawa | 438/18 |
| 6,809,332 B1 * | 10/2004 | Imahara et al. | 257/798 |
| 6,878,900 B1 * | 4/2005 | Corkum et al. | 219/121.69 |
| 2002/0025600 A1 * | 2/2002 | Lowry | 438/106 |

(Continued)

FOREIGN PATENT DOCUMENTS

DE       195 09 231       9/1996

(Continued)

Primary Examiner—Matthew Smith
Assistant Examiner—Khiem Nguyen
(74) Attorney, Agent, or Firm—W. F. Fasse; W. G. Fasse

(57) ABSTRACT

In a method of opening of a housing of a plastic-housed electronic module by a laser, the electronic module is protected from the effects of the laser beam and the laser beam is stopped at a suitable time by providing an end point signal detection due to the laser beam impinging on a protective layer. Thereby, after opening the housing, electrical measurements can be carried out on the electronic module.

20 Claims, 1 Drawing Sheet

U.S. PATENT DOCUMENTS

2002/0049511 A1* 4/2002 Brandinger et al. ........ 700/166
2003/0131932 A1* 7/2003 Hoult et al. ............. 156/272.8
2005/0199521 A1* 9/2005 Givens, Jr. ................. 206/364

FOREIGN PATENT DOCUMENTS

| EP | 0353463 | 2/1990 |
| EP | 0694975 | 1/1996 |
| FR | 2731637 | 9/1996 |
| GB | 2177965 | 2/1987 |
| WO | WO01/54853 | 8/2001 |

* cited by examiner

METHOD FOR OPENING THE PLASTIC
HOUSING OF AN ELECTRONIC MODULE

FIELD OF THE INVENTION

The present invention relates to a method for the opening of the housing, embodied as a partial or total potting, of a plastic-housed electronic module or assembly.

BACKGROUND INFORMATION

Generally, methods for opening an electronic module, such as an integrated circuit, for example, are used to control electrical parameters of the potted module. A further important application of the housing-opening methods is in the field of the reject refurbishing or repairing processing, in order to find the cause of an electrical malfunction and especially to investigate or test the reliability of the potting/molding process of the electronic module. In this context it is advantageous to open the housing of an electronic module and to carry out electrical measurements on contact surfaces that lie within the housing. For this purpose it is necessary to open the potting compound masses of the plastic housings, which comprise both various different binder agents as well as various different filler materials, in a selective manner, that is to say without damaging the internally arranged electronic assemblies or modules. Thereafter, it is possible, for example, to recognize or determine a delamination between the connection of a connecting wire (bond) and a contact surface lying in the housing, or to test the function of circuit blocks of an integrated circuit by an electrical measurement on those contact surfaces that are not connected by connecting wires. The purpose of this process is to find the cause of an electrical malfunction, especially in connection with complaints or rejects from customers. In this context, there exists the difficulty, that while opening the housing, upon long term influence of the laser beam on the surface of the electronic module, the electrical parameters may possibly be changed.

SUMMARY OF THE INVENTION

It is the object of the present invention to open the plastic housing of a potted electronic module in a manner that is automated so far as possible, and especially to avoid a destruction of an internally arranged electronic assembly or module.

The above mentioned object has been achieved according to the invention in a method of opening a plastic potted housing of an electronic module.

According to this, the essence of the invention is that a housing is opened selectively relative tot he electronic module, in order to carry out measurements on the internally arranged assembly or module. For this purpose, on a housing of plastic produced as a partial or total potting, which comprises at least one electrical contact surface lying in the potting compound and one connection line extended out of the potting compound, a part of the potting compound is removed by means of a laser beam for exposing the contact surface, so long until an end point is detected.

An advantage of the method is that, with the aid of the detection of the end point, the housing of an electronic module can be opened selectively relative to the electronic module by means of a laser beam, without thereby damaging the plastic-housed electronic module and thereby unintentionally changing electrical parameters. In this context, the end point can be determined both from the analysis of the chemical composition of the vaporizing material as well as by means of an optical measurement, for example by determination of the reflection and/or of the absorption behavior, whereby especially through the exposing of metallic contact surfaces the optical characteristics in the area to be opened are sharply or strongly changed, and the end point signal can be especially reliably produced by means of an optical measurement. Furthermore, the reliability of the method may be increased by an over-running time after the detection of the end point, whereby it is advantageous to reduce the power of the laser beam.

In a further development, the end point is produced by means of a protective layer, which ends the removal of the potting compound. In order to avoid residues of the potting compound on the protective layer it is advantageous, after the detection of the end point, to switch off the laser beam only after an over-running time, in which the power of the laser beam is preferably reduced. Furthermore, the end point signal may be produced both from a change of the chemical composition as well as from a density change of the evaporating material, whereby the change of the chemical composition can be detected by means of a spectroscopic analysis of the evaporating material. Moreover, the end point signal can be produced through an optical monitoring by means of a photodetector, whereby, especially in connection with an opaque protective layer, a change of the contrast relationships or ratios, which is produced by metallized areas for example, can be evaluated.

A further advantage of the opening of the plastic housing, which comprises a protective layer, is that the electronic module is reliably protected against being damaged by means of the protective layer, in plastic housings with various different chemical compositions, especially also comprising such compounds in which other binder agents or alternative filler materials are used. In this context, the plastic of the housing is evaporated by the energy of the laser beam, whereby the potting compound comprises a high removal rate and the protective layer comprises a small removal rate, so that after a prescribed time, which is determined by means of a reference formation, the opening of the housing may be ended. Experiments of the applicant have shown that the selectivity in the removal rate between the protective layer and the potting compound is determined from the differences in the optical characteristics in the range of the laser wavelengths, the differences in the melting points, and the differences in the evaporation temperatures. Furthermore, both a single material layer as well as a multiple-material layer, which consist of organic or inorganic compounds, can be used as the protective layer. For example, polyimide or siloxane as the organic protective layer, and nitride or oxide layers as the inorganic protective layer, as well as thin structured or patterned metal layers can be used. In order to reduce the production costs of the protective layer, it is advantageous to integrate the application of the protective layer in the fabrication or production process of the electronic module, for example in the fabrication of an integrated circuit. For this purpose, the protective layer is applied at the end of the fabrication process of the integrated circuit, whereby experiments of the applicant have shown that the electronic module can be reliably protected with layer thicknesses in the range of a few microns. The method may especially be advantageously used for searching for faults or defects in potted electronic circuits. For this purpose, the potting compound mass is removed up to (or down to) the protective layer and thereafter the conductor paths or traces are contacted without removal of the protective layer, for example at a peak measuring location, in order to test the electrical function of individual circuit blocks. A search for faults or defects is thereby considerably accelerated. Furthermore, similar housings may be opened in an automated manner, in that the process parameters of opening a preceding housing are stored in memory as a reference.

In a different further development of the method, for producing the end point signal, the absorption constant of the protective layer is set smaller than the absorption constant of the potting compound, in that different binder agents and additive or filler materials are used. In this context, the producing of the end point signal by means of the optical detector is substantially simplified. Furthermore, the potting compound comprises a higher removal rate in comparison to the protective layer, because the energy absorption of the layer is proportional to its absorption constant. In a different further development of the method, an increased reflection is produced on the protective layer for obtaining an end point signal, in that the refractive index of the protective layer is increased in comparison to the potting compound. The magnitude of the reflection is measured by the optical detector, and an end point is indicated above a prescribed value.

In a further development of the method, the protective layer is structured or patterned by means of a mask step. Especially in an integration of the protective layer, which, for example, consists of polyimide, into the production or fabrication process of an integrated circuit, it is advantageous to carry out the structuring or patterning with a contact window mask and by means of an economical wet chemical process. Through the removal of the protective layer in the areas of the contact windows, the protective layer may be applied before the connecting or bonding of the connecting wires (bonding). Furthermore, there is no protective layer on the contact surfaces when opening the potting compound by means of the laser. Hereby, the contact surfaces may be more easily contacted in connection with electrical measurements.

In a different further development of the method, the reliability of the method can be increased by a post-running or over-running time after the detection of the end point, whereby it is advantageous to reduce the power of the laser beam during the post-running or over-running time.

Other experiments of applicant have shown that it is advantageous to remove rest or residues of the potting compound by a wet chemical process step before the electrical measurement. Hereby, the contact resistances of an electrical contacting can be reduced, and existing conductive carbon compounds, which preferably only arise at high powers of the laser beam, can be removed from the surface.

In a different further development of the method, the protective layer is removed in a wet chemical manner. Especially with full-surface protective layers, which cover the connection surfaces of the electronic module and are applied after the bonding, the further analysis steps become simpler through the removal of the protective layer. Furthermore, residues of the potting compound can also be removed through the wet chemical cleaning step. In this context, the contact resistances of an electrical contacting are reduced and the surface is cleaned of existing conductive carbon compounds, which preferably arise at high powers of the laser beam.

BRIEF DESCRIPTION OF THE DRAWINGS

In the following, the method according to the invention shall be explained on the basis of example embodiments in connection with schematic drawings. It is shown by.

DETAILED DESCRIPTION OF PREFERRED EXAMPLE EMBODIMENT OF THE INVENTION

Figure 1:
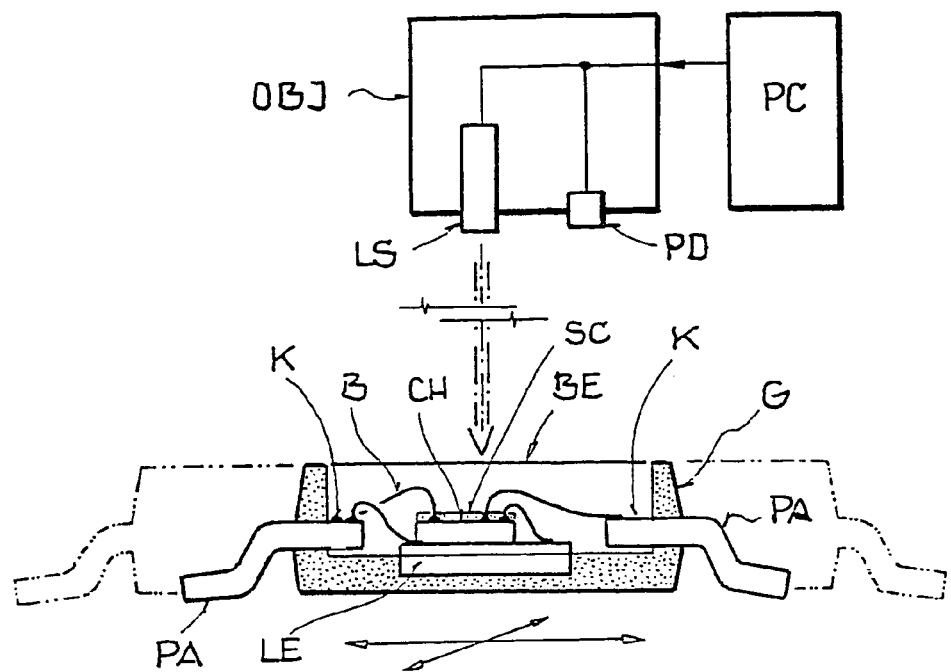
FIG. 1 an electronic module which is protected by means of a protective layer during the opening of the housing, and FIG. 2 an integrated circuit that has been laser-exposed.

The apparatus illustrated in FIG. 1 comprises an optical unit OBJ with a laser LS, which comprises a wavelength lying in the infrared spectral range. The laser beam of the laser LS is chopped into short laser pulses by means of a rotating shutter or aperture (not illustrated). In this context, the speed of the rotating shutter determines the duration of the laser pulses of the laser LS. Moreover, the optical unit OBJ comprises an optical detector PD for a detection of a contrast change. Furthermore, for the control, the optical unit OBJ is connected with a personal computer PC. From the optical unit OBJ, the laser beam of the laser LS is imaged or projected onto the surface of a plastic housing G embodied as a complete or total potting, whereby the focal distance and the deflection of the laser beam of the laser LS on the surface of the plastic housing G can be shifted by means of a mirror and lens arrangement. Furthermore, an electronic module or assembly CH, which is contacted by means of connecting or bond wires B onto a metal strip LE and with connection or terminal pins PA, is molded or potted in the plastic housing G. Furthermore, the electronic module or assembly CH comprises, on the surface, a structured or patterned protective layer SC of plastic, whereby the thickness of the protective layer SC lies in the range of a few microns. In this context, the protective layer SC was structured or patterned by means of a contact window mask, that is to say the contact surfaces of the electronic module CH have no protective layer SC. Moreover, during the opening, the housing G is fixed by means of a vacuum or reduced pressure on a contact or support plate (not illustrated).

For opening the plastic housing G of the electronic module CH, an area BE that is to be opened is defined on the surface of the plastic housing G, by means of the optical unit OBJ which is controlled by the personal computer PC, and the coordinates of the area BE are stored in the personal computer PC. Thereafter, within the area BE, the surface of the housing G is swept with the pulsed beam of the laser LS along a zig-zag shaped line. In this context, the pulse duration and the focal distance of the laser beam of the laser LS determine the quantity of energy impinging onto the housing surface. Experiments of the applicant have shown that the power of the laser beam may be especially easily adapted or matched to the chemical composition of the potting compound by a change of the pulse duration in connection with a pulse-form laser beam, so that a deposition of conductive carbon compounds on the surface of the housing is suppressed. Furthermore, the offset speed of the laser pulses along the zig-zag shaped line is determined by the pulse duration. By successively arranging the laser pulses in a row along the zig-zag shaped line, the plastic in the area BE is evaporated in a layer-wise manner, whereby the area BE is traversed multiple times along zig-zag shaped lines in connection with greater thicknesses of the plastic layer to be removed. Other experiments of the applicant have shown that an especially uniform removal is achieved by the guidance of the laser beam in a zig-zag shaped line, and thereby already a thin protective layer reliably protects the electronic module.

In this context it is advantageous if the evaporated plastic is sucked or vacuumed away during the opening of the housing and does not become deposited on the surface of the housing G. Furthermore, the opening is monitored or controlled by means of the optical detector PD especially with reference to a change of the contrast relationships or ratios. Experiments of the applicant have shown that the plastic of the housing G can be quickly removed up to (or down to) the protective layer SC, that is to say with a high removal rate, through a corresponding selection of the parameters of the laser beam of the laser LS. Due to the other or different optical characteristics, the protective layer SC comprises a small removal rate in comparison to the potting material, and produces an end point signal in the optical detector PD through the changed contrast relationships or ratios due to the metallic contact surfaces of the electronic module CH. The opening is ended or terminated as soon as the value of the contrast change in the opened area exceeds a prescribed threshold value. To the extent that the opened area BE comprises remainders or residues of the potting material, these may be removed in a so-called cleaning step. For this purpose, during a prescribed over-running time, the laser beam sweeps or passes over the area BE to be opened, with a power that is sharply reduced in comparison to the preceding opening step. To the extent that the protective layer SC in the opened area BE hinders or interferes with subsequent analyses, the protective layer SC is removed in a wet chemical cleaning step. Experiments of the applicant have shown that especially highly ohmic shunt connections on the surface can be removed with the wet chemical cleaning step, and an extraction of electrical parameters is accelerated.

It is an advantage of the method that the plastic of the housing can be evaporated selectively relative to the protective layer SC by means of a laser beam, and the electronic module CH is reliably protected from the influence of the laser pulses and especially the electrical parameters of the electronic module are not changed. Through the protective layer SC in connection with the laser beam, the housings can be quickly opened, whereby the opening can be automatically carried out through the end point recognition. Through the wet chemical cleaning, the surface is conditioned, that is to say cleaned of remainders or residues of the evaporated potting compound. Subsequent analyses can be carried out quickly and economically. Experiments of the applicant have shown that the power of the laser beam is only slightly dependent on the chemical composition or the proportion of embedded foreign materials in connection with the opening of various different types of housings. Furthermore, due to the absorption spectra of the plastics used in the field of the housings, it is advantageous to use a laser wavelength in the infrared spectral region for the opening of the potting compound, whereby, through a suitable selection of the power and the time duration of the laser pulses, the plastic of the housing is evaporated and a spreading or expansion of a heat wave in the remaining plastic is suppressed through the energy absorption that takes place in connection therewith. Furthermore, the potting of the entire electronic module can be removed up to (or down to) the protective layer in a single work step, or several areas that are to be opened can be fixed, which, for example, in sum only encompass a portion of the surface of the housing. In this context, the individual areas can be opened in various different sequences, and between the individual opening steps one or more wet chemical cleanings and/or electrical measurements can be carried out.

Figure 2:
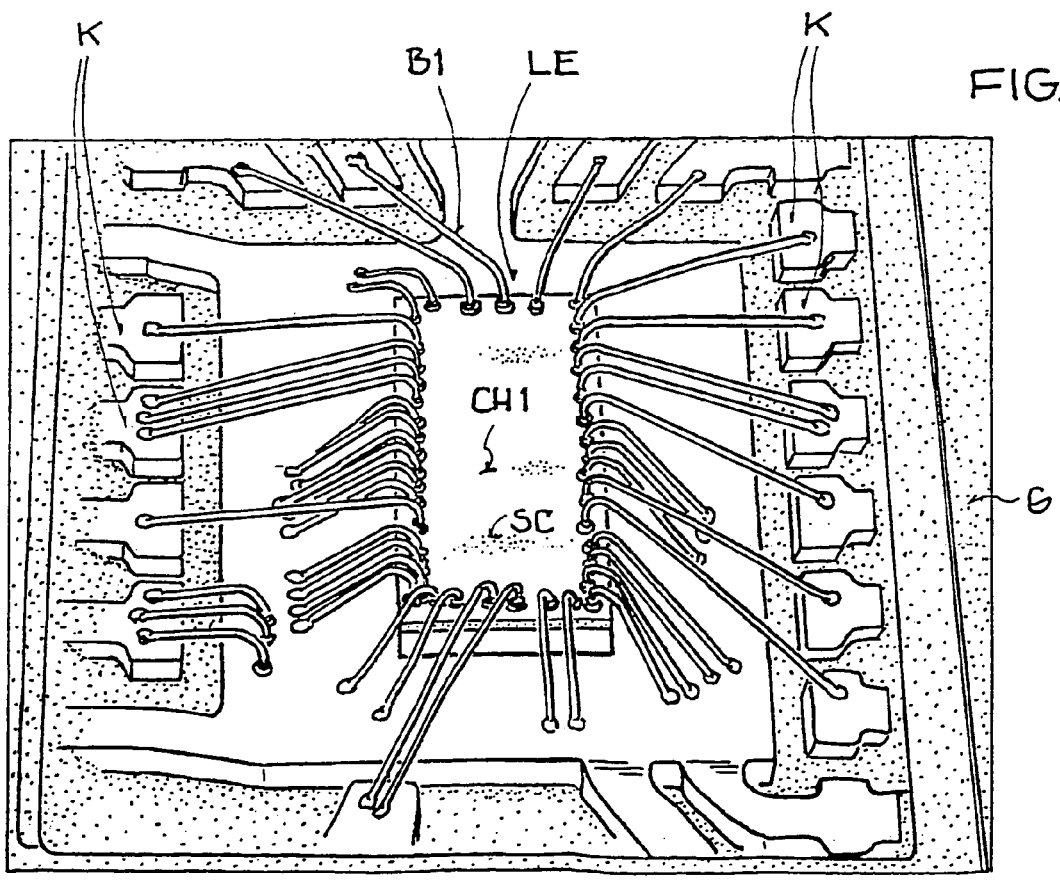

A drawing of an electron microscope photograph of a metal strip LE and an integrated circuit CH1 fixed thereon and connected by bond wires B1 to contact pads K is shown in FIG. 2. In this context, the plastic of the housing was removed selectively relative to the protective layer SC with a multiple layer-wise removal by means of the laser. Furthermore, in a subsequent cleaning step, the protective layer Sc was removed. By contacting individual conductor paths and contact surfaces K on the exposed electronic circuit CH1, which conductor paths and contact surfaces are not connected by means of connecting or bonding wires, the electrical functions of individual circuit blocks, which are not accessible in the potted condition, can be tested. Furthermore, additional analyses, such as an optical monitoring or control, for example, can be carried out.

The invention claimed is:

1. Method for the opening of a plastic-housed electronic module (CH) in a housing (G) of a plastic potting compound produced as a partial or total a potting, with at least one electrical contact surface (K) lying in the potting compound and connection lines extended out of the potting compound, characterized in that for exposing the contact surface (K) by means of a laser beam, a portion of the potting compound is removed by the laser beam, and an end point signal is produced by the laser beam impinging on a protective layer (SC) lying on the surface of the electronic module, and the removal of the potting compound by the laser beam is ended in response to the end point signal, and after the removal of the potting compound by the laser beam, the protective layer is removed by etching.

2. Method according to claim 1, in which a first absorption constant of the protective layer (SC) is smaller than a second absorption constant of the potting compound.

3. Method according to claim 1, in which at least a portion of the laser beam is reflected on the protective layer (SC).

4. Method according to claim 1, in which the protective layer (SC) is patterned before applying the potting compound.

5. Method according to claim 1, in which a further removal of the protective layer and/or of the potting compound by the laser beam is carried out during a prescribed overrunning time after a detection of the end point signal.

6. Method according to claim 1, in which the protective layer (SC) is removed by the etching in a wet chemical manner.

7. A method of opening a plastic-housed electronic module including an electronic component, a protective layer disposed on at least a portion of said electronic component, and a plastic potting compound forming a housing at least partially around said electronic component, wherein said method comprises the steps:

a) impinging a laser beam onto said potting compound and thereby vaporizing and removing at least a portion of said potting compound disposed on said electronic component;

b) carrying out said impinging until said laser beam impinges onto said protective layer;

c) producing an end point signal in response and due to said laser beam impinging on said protective layer;

d) ending said impinging by said laser beam in response to said end point signal; and e) after said step d), removing at least some of said protective layer by etching.

8. The method according to claim 7, wherein said step c) comprises analyzing a chemical composition of a vaporized material resulting during said steps a) and b), and producing said end point signal in response to a predetermined change of said chemical composition due to said laser beam impinging on said protective layer.

9. The method according to claim 7, wherein said step c) comprises analyzing a density of a vaporized material resulting during said steps a) and b), and producing said end point signal in response to a predetermined change of said density due to said laser beam impinging on said protective layer.

10. The method according to claim 7, wherein said step c) comprises performing an optical detection of light returned from said electronic module during said steps a) and b), and producing said end point signal in response to a predetermined change of at least one of a reflection characteristic, an absorption characteristic, or a contrast ratio with respect to said laser beam due to said laser beam impinging on said protective layer.

11. The method according to claim 7, in which said protective layer has a first absorption constant with respect to said laser beam, said potting compound has a second absorption constant with respect to said laser beam, and said first absorption constant is smaller than said second absorption constant.

12. The method according to claim 7, wherein said step d) comprises detecting said end point signal and ending said impinging by said laser beam only when a prescribed overrunning time has elapsed after said end point signal has been detected, thereby further removing at least some of said potting compound and/or said protective layer by said laser beam during said over-running time.

13. The method according to claim 12, wherein said impinging of said laser beam onto said protective layer during said over-running time vaporizes and removes at least some of said protective layer.

14. The method according to claim 12, further comprising partially reducing a power of said laser beam during said over-running time in comparison to during said step a) and then switching off said laser beam when said over-running time has elapsed.

15. The method according to claim 7, wherein said etching comprises performing a wet chemical etch to remove at least some of said protective layer.

16. The method according to claim 7, wherein said protective layer comprises an organic compound.

17. The method according to claim 7, wherein said protective layer comprises an inorganic compound.

18. The method according to claim 7, wherein said protective layer comprises a metal layer.

19. The method according to claim 7, wherein said protective layer has a thickness of a few microns.

20. A method of opening a plastic-housed electronic module including an electronic component, a protective layer disposed on at least a portion of said electronic component, and a plastic potting compound forming a housing at least partially around said electronic component, wherein said method comprises the steps:

a) impinging a laser beam onto said potting compound and thereby emanating a vaporized material by vaporizing and removing at least a portion of said potting compound disposed on said electronic component;

b) carrying out said impinging until said laser beam impinges onto said protective layer;

c) during said steps a) and b), using a detector and a computer, detecting and analyzing said vaporized material;

d) using at least one of said computer or said detector, producing an end point signal in response to a predetermined change of said vaporized material as detected and analyzed in said step c); and e) ending said impinging by said laser beam in response to said end point signal.

* * * * *

UNITED STATES PATENT AND TRADEMARK OFFICE
CERTIFICATE OF CORRECTION

| | | |
|---|---|---|
| PATENT NO. | : 7,125,729 B2 | Page 1 of 1 |
| APPLICATION NO. | : 10/494434 | |
| DATED | : October 24, 2006 | |
| INVENTOR(S) | : Burger et al. | |

It is certified that error appears in the above-identified patent and that said Letters Patent is hereby corrected as shown below:

<u>Title page,</u>
Item [57], ABSTRACT,
Line 1, after "opening" delete "of";

<u>Column 1,</u>
Line 52, after "relative", replace "tot he" by --to the--;

<u>Column 3,</u>
Line 43, after "of", insert --the--;
Line 44, after "remove", replace "rest" by --rests--;

<u>Column 4,</u>
Line 5, after "OF", insert --A--;

<u>Column 6,</u>
Line 5, before "was", replace "Sc" by --SC--;
Line 17, after "total", delete "a";
Line 42, before "time", replace "overrunning" by --over-running--;

<u>Column 7,</u>
Line 26, before "time", replace "overrunning" by --over-running--.

Signed and Sealed this

Fifteenth Day of May, 2007

JON W. DUDAS
*Director of the United States Patent and Trademark Office*